(12) United States Patent
Berlin et al.

(10) Patent No.: US 9,704,691 B2
(45) Date of Patent: Jul. 11, 2017

(54) PLASMA GENERATOR

(71) Applicants: Evgenij Vladimirovich Berlin, Moscow (RU); Vasily Juryevich Grigoryev, Moscow (RU)

(72) Inventors: Evgenij Vladimirovich Berlin, Moscow (RU); Vasily Juryevich Grigoryev, Moscow (RU)

(*) Notice: Subject to any disclaimer, the term of this patent is extended or adjusted under 35 U.S.C. 154(b) by 0 days.

(21) Appl. No.: 14/396,361

(22) PCT Filed: Mar. 28, 2013

(86) PCT No.: PCT/RU2013/000263
§ 371 (c)(1),
(2) Date: Jan. 28, 2015

(87) PCT Pub. No.: WO2013/162419
PCT Pub. Date: Oct. 31, 2013

(65) Prior Publication Data
US 2015/0279620 A1    Oct. 1, 2015

(30) Foreign Application Priority Data

Apr. 24, 2012  (RU) ................................ 2012116222

(51) Int. Cl.
*C23C 16/50* (2006.01)
*H01J 37/32* (2006.01)
*H01J 37/04* (2006.01)

(52) U.S. Cl.
CPC ........... *H01J 37/3211* (2013.01); *H01J 37/04* (2013.01); *H01J 37/321* (2013.01); *H01J 2237/002* (2013.01); *H01J 2237/036* (2013.01)

(58) Field of Classification Search
CPC ............................. H01J 37/321; H01J 37/3211
USPC ................................ 118/724, 723 AN, 723 R
See application file for complete search history.

(56) References Cited

U.S. PATENT DOCUMENTS

| | | |
|---|---|---|
| 5,231,334 A | 7/1993 | Paranjpe |
| 5,580,385 A | 12/1996 | Paranjpe et al. |
| 6,463,875 B1 | 10/2002 | Chen et al. |
| 7,591,232 B2 | 9/2009 | Vukovic |
| 8,206,604 B2 | 6/2012 | Dine |
| 2004/0060517 A1* | 4/2004 | Vukovic ............... H01J 37/321 118/723 I |
| 2004/0149387 A1 | 8/2004 | Kim et al. |
| 2006/0081185 A1* | 4/2006 | Mauck ............... H01J 37/321 118/723 I |
| 2006/0137611 A1 | 6/2006 | Choe et al. |

(Continued)

FOREIGN PATENT DOCUMENTS

| | | |
|---|---|---|
| EP | 0690666 A1 | 1/1996 |
| RU | 2171555 | 7/2001 |

*Primary Examiner* — Tuyet Vo
(74) *Attorney, Agent, or Firm* — Brinks Gilson & Lione

(57) ABSTRACT

The invention relates to devices intended for treatment of materials in gas discharge plasma of low temperature, namely the induction plasma generator, placed inside the process volume (working chamber). The technical problem to be solved by the proposed invention is to increase the efficiency of the device; to improve the reliability of the device, increase purity of plasma environment and increase density of plasma generated; increase the life of device; reduce the level of noise; reduce the size of the device.

5 Claims, 3 Drawing Sheets

(56) References Cited

U.S. PATENT DOCUMENTS

Figure 1:
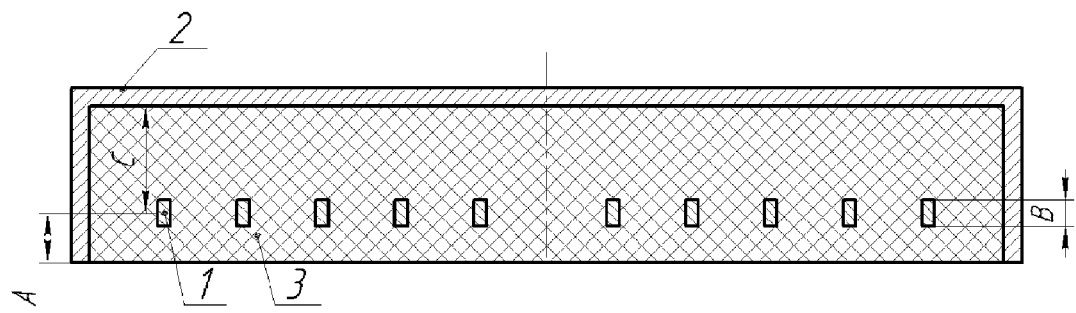

2007/0235327 A1 10/2007 Vukovic
2010/0279028 A1 11/2010 Dine

* cited by examiner

PLASMA GENERATOR

RELATED APPLICATIONS

This application claims priority to International Application No. PCT/RU2013/000263, filed on Mar. 28, 2013, and incorporated herewith by reference in its entirety.

FIELD OF THE INVENTION

The invention relates to devices intended for treatment of materials in low temperature plasma of gas discharge, namely the inductive plasma generator, placed inside the process volume (working chamber).

BACKGROUND OF THE INVENTION

There is a device for plasma processing comprising an inductively coupled plasma source that is located inside the processing chamber, consisting of an antenna placed in a dielectric spacer, while the antenna and spacer are placed in a sealed insulating housing. (U.S. Pat. No. 5,580,385, МПк (C23C16/00, C23C16/50, published Mar. 12, 1996)

A disadvantage of the known device is unstable operation and low efficiency caused by the fact that alternating magnetic field penetrates through the housing on side of plasma generator or behind it that can lead to unstable spurious discharge.

There is a high-frequency gas discharge ion source of high-density with low-impedance antenna comprising a coil housed in working chamber, formed into a conductive coil, while the gap between the windings is filled with dielectric, and coil itself is separated from the working chamber by dielectric layer, the thickness d of dielectric, separating the coil from the working chamber, does not exceed the value of S, and the distance l from the coil to the nearest conductive surface of the working chamber exceeds triple value of B, where S is the maximum of the values $(\hat{\ }, R)$; R is maximum transverse linear dimension of the conductor, from which antenna spiral is made of; $B = \hat{\ } + d$, $\hat{\ } = c/\omega_{Pe}$ – the depth of penetration of high-frequency electric field in plasma during operation; c – speed of light; $\omega_{Pe} = (4\pi n_e e^2/m)^{1/2}$ – electron Langmuir frequency of plasma $(c^{-1})$; $n_e$ – electron density in plasma $(cm^{-3})$; e, m – charge $(4,8 \times 10^{-10}$ StatC) and mass of electron (g). (RF Patent number 2171555, H01J37/32; H05H1/46, published Jul. 27, 2001)

The known technology has the following disadvantages: limited scope of application due to the limitation of minimum possible size of working chamber. For example, if the working chamber is a cylinder and the coil is located on its axis, the desired plasma concentration generated is $10^{12}$ $cm^{-3}$, minimum diameter of working chamber is 180 mm larger than the diameter of the coil, low efficiency of application of high frequency current energy to generate plasma in that part of the working chamber where it is required. This is due to the fact that high-frequency fields penetrate into the volume of the working chamber not only where it is required to generate plasma used in the process, but also where they cause spurious discharge obstructing maintaining steady operation of device and causing undesired plasma on those surfaces where it is not required, low reliability as high-frequency fields fill a larger volume than is required, the known device has a large leakage inductance, which leads to excessively high voltage on the coil, which in turn may lead to etching of dielectric.

The closest as for technical nature of the present invention is plasma source, consisting of a helical coil which is placed inside a cylindrical conductive screen, which is opened at one of the bases, with a space between coil windings and between the coil and the screen filled with a dielectric. (U.S. Pat. No. 5,231,334, МПк H01J37/08; H01J37/32; H05H1/46, published Jul. 27, 2012)

A disadvantage of the known device is the low efficiency and low operating reliability due to the fact that the screen is located closer to the coil than plasma that leads to an increase in current flowing through the coil and a strong increase in ohmic losses in the screen. Also, due to the strong inductive coupling between the coil and the screen when you turn on the device high power is required to ensure the value of high voltage on coil sufficient for the breakdown of gaseous medium in working chamber.

The technical problems to be solved by the proposed invention are: increasing the efficiency of the device; reducing the level of RF noise; increasing the life of the device; improving the reliability of the device; increasing density of plasma generated; increasing purity of plasma medium; and reducing the size of the device.

SUMMARY OF THE INVENTION

The stated technical problem is solved by the following: plasma generator as per first design (embodiment), comprising a helical coil, placed inside a conducting screen, an inner surface of which is of a nearly cylindrical shape, moreover the space between the coil windings and between the coil and the screen is filled with dielectric, according to the claimed invention, has a flat coil, the distance from the plane of the coil to outer surface of dielectric is less than double thickness of the coil, and the distance from the plane of the coil to the base of inner surface of the screen is greater than double distance from the plane of the coil to outer surface of dielectric.

In addition, plasma generator of the first embodiment is characterized by the following additional significant features: there is a coaxial input provided for supplying high frequency current to the coil, the inner conductor is connected to one end of the coil, and outer conductor is connected to other end of the coil; coaxial input is arranged to supply therethrough a cooling fluid or gas to the coil; coil conductors are hollow to supply therethrough a cooling fluid or gas.

The stated technical problem is also solved by the fact that plasma generator of the second embodiment, comprising a helical coil, placed inside the conductive screen, internal surface of which is of a nearly cylindrical shape, with a space between the coil windings and between the coil and the screen filled with dielectric, according to the claimed invention has a flat coil, the screen is in the form of a ring, the axis of which is perpendicular to the plane of the coil, the edge of the ring facing the volume, where it is required to generate plasma, is closed with dielectric.

The stated technical problem is solved by the following solution: the screen of plasma generator of the third embodiment, comprising a helical coil, placed inside the conductive screen, internal surface of which is of a nearly cylindrical shape, with a space between the coil windings and between the coil and the screen filled with dielectric, according to the present invention, is electrically connected to one end of the coil, and the permittivity of the dielectric is in the range of 2.5 to 50.

In addition, plasma generator of all three embodiments is characterized by the following additional significant features: dielectric separating the coil from the working surface of the device is made of a material resistant to plasma; the outer surface of insulator is closed by at least one dielectric screen made of material resistant to plasma, with the distance from the plane of the coil to outer surface of dielectric screen less than double thickness of the coil; there is a gap between the screen and outer surface of dielectric; the outer surface of insulator is closed by at least two dielectric screens, one of which is made of a material resistant to plasma, with a gap between the screens; insulating filling consists of a dielectric cylinder, separating the coil from the base of inner surface of the screen, dielectric inserts, filling the space between the coil windings, and dielectric plate separating the coil from working surface of the device. dielectric plate is made of a material resistant to plasma; between the dielectric plate and the coil, as well as between dielectric plate and the dielectric inserts, there is a gap; the outer surface of insulator is closed by at least one dielectric screen made of material resistant to plasma, with the distance from the plane of the coil to outer surface of dielectric screen less than double thickness of the coil; there is a gap between the screen and outer surface of dielectric.

Technical result, the achievement of which is provided by the implementation of inventive combination of essential features, is:

1. Localization of high-frequency electromagnetic fields in that part of the process volume (working chamber), which requires generation of plasma and reducing in other parts of the apparatus that allows to: increase efficiency by preventing the occurrence of spurious discharge around the device, increase the service life by reducing exposure of plasma to the device components, increase the purity of plasma environment by reducing the impact of plasma on the walls of process chamber and parts of intrachamber tooling and reduce contamination of the process medium with products of plasma chemical reactions and sputtering of materials the device is manufactured of.

Localization of high-frequency fields is achieved by using a conductive screen that does not pass high frequency magnetic field. To reduce the losses caused by occurrence of eddy currents in the screen, it must be made of a material having low resistivity such as copper or aluminum alloy. Increasing the inductance between the coil and plasma, as well as increasing the capacity between the outer surface of dielectric and windings that facilitates the breakdown of gas medium working volume and reliability of ignition of discharge, thereby provides greater reliability of device operation in a wide range of parameters of process environment.

Increasing the inductance between plasma and coil, as well as reducing the capacity between the outer surface of dielectric and windings, is provided with decreasing distance from windings to working volume. This is ensured by coil flat design and placing it no further than double thickness of dielectric surface. Reducing the inductance between coil and conductive screen, and plasma generator power supply circuits that reduces noise level and increases efficiency of the device by reducing thermal power dissipated in construction parts, currents, including those induced by electromagnetic induction.

High-frequency fields' tension in plasma, providing transmission of energy from coil to plasma, is determined by the transmitted power. Eddy currents induced in conducting screen create magnetic field that weakens the field of coil. To compensate this attenuation it is necessary to increase the power of high frequency current supplied to the coil, increasing losses therein and in power circuits and noise level. Therefore, the screen must be located farther from plasma than the coil so to reduce eddy currents, and magnetic field must be smaller than the field of the coil in area occupied by plasma. Through numerical simulation and experimental verification claimed ratio of distances between thickness of coil, distance from it to the surface of dielectric and conductive screen, has been received.

Also, the use of dielectric filler with dielectric capacitivity in the range of 2.5 to 50 reduces the effective inductance of the coil due to the partial compensation of its increased capacity between the coil and the screen.

DETAILED DESCRIPTION OF THE INVENTION

Figure 2:
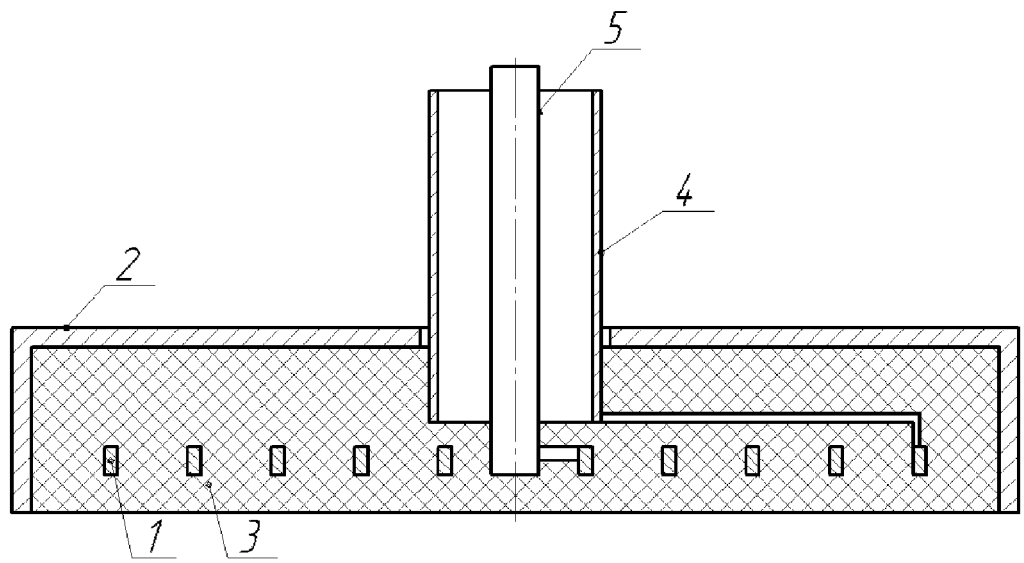
Figure 3:
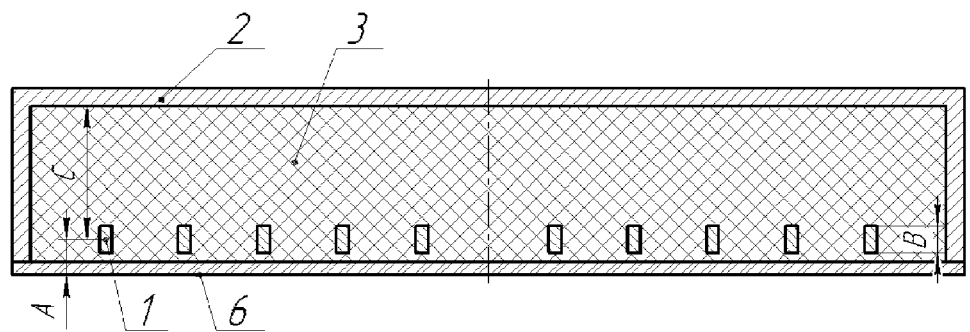
Figure 4:
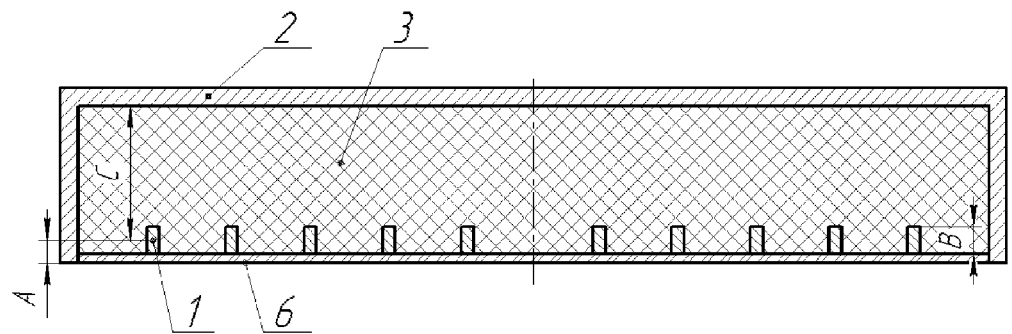
Figure 5:
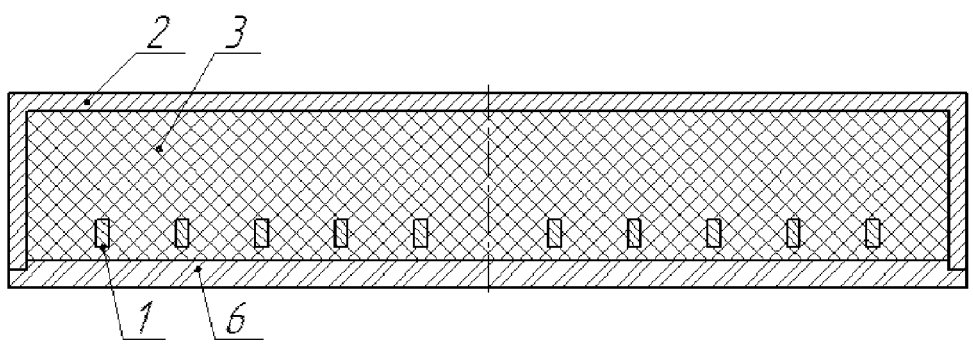
Figure 6:
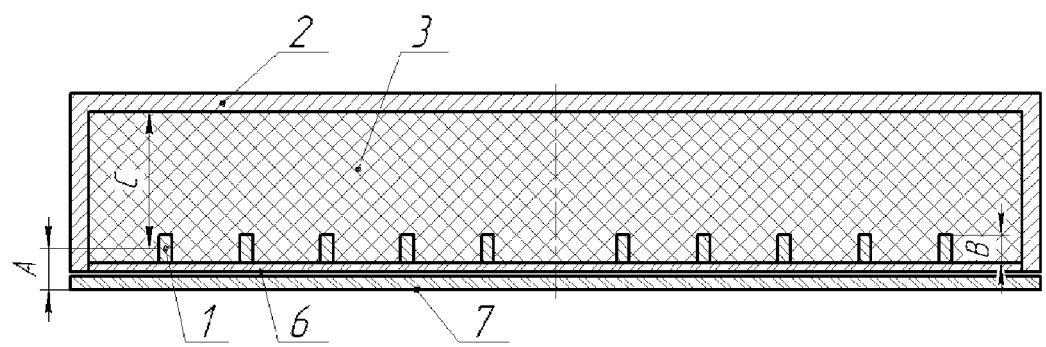
Figure 7:
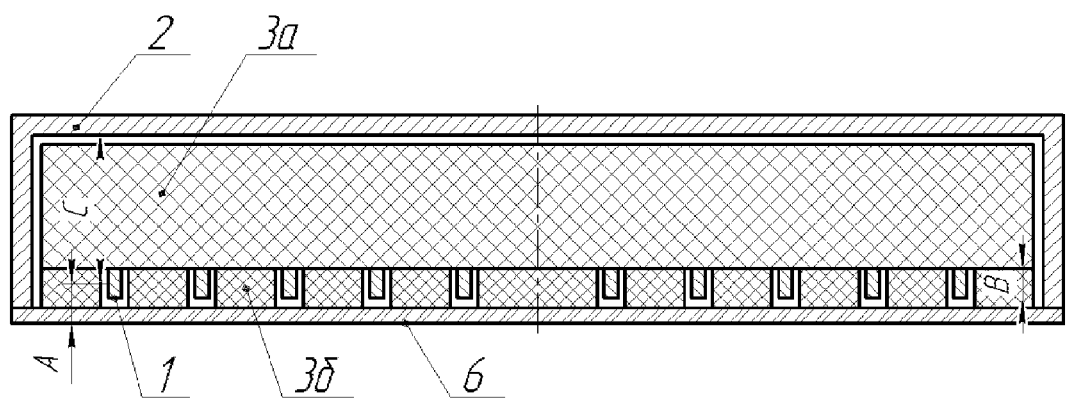

The essence of claimed invention is explained by drawings, where on FIG. 1 there is a sectional view of proposed device structure; on FIG. 2 there is a sectional view of construction with coaxial input, the inner conductor is connected to one end of the coil, and outer conductor is connected to the other end of the coil; on FIGS. 3 and 5 there are sectional views that show how the outer surface of insulator is closed by dielectric screen made of material resistant to plasma; on FIG. 4 there is a sectional view of construction with dielectric separating the coil from the working surface of the device made of a material resistant to plasma; on FIG. 6 there is a sectional view that shows how the outer surface of the insulator is closed by dielectric screen made of material resistant to plasma, with the distance from the plane of the coil to outer surface of dielectric screen less than double thickness of the coil; on FIG. 7 there is a sectional view that shows insulating filling that consists of a dielectric cylinder, separating the coil from the base of inner surface of the screen, dielectric inserts, filling the space between the coil windings, and dielectric plate separating the coil from working surface of the device.

The figures contain the following items:
1—flat spiral coil;
2—conductive screen;
3—dielectric filler;
3a—dielectric cylinder (FIG. 7);
3b—dielectric inserts (FIG. 7);
4—outer conductor of coaxial input;
5—inner conductor of coaxial input;
6—dielectric plate, resistant to plasma;
7—dielectric screen;
A—distance from plane of the coil to dielectric surface;
B—coil thickness;
C—distance from plane of the coil to the base of inner surface of the screen.

Following terms have the following meanings:

High frequency—frequency in the range of 0.5 . . . 100 MHz.

High-density plasma—plasma with an electron density of at least $10^{11}$ cm$^{-3}$.

Coil—conductor in the form of single or multi-start helix. Multiple-spiral is at least two spiral conductors of the same shape arranged with the rotation relative to each other about a common axis. In present description a ring is considered to be a single-pass single-turn coil.

Coaxial input—device comprises a hollow conductor in the inner cavity of which at least one inner conductor is placed.

Flat coil—coil which can be inscribed in a cylinder which height is no more than twice greater than two values: winding pitch and the largest linear dimension of cross section of the coil. The plane of the coil—a plane equidistant from the base of the cylinder.

Thickness of flat coil means height of the cylinder.

The plasma generator (1) comprises a helical coil 1 that is placed inside conducting screen 2, the inner surface of which is of a nearly cylindrical shape. The space between the coil windings and between coil 1 and screen 2 is filled with dielectric 3. In particular, there are dielectric inserts between the coil windings.

The coil 1 is flat. Flat coil design ensures simultaneously maximum inductive coupling between coil and plasma and minimal inductive coupling between coil and screen within given size of device.

Distance from plane of the coil to outer surface of dielectric is chosen smaller than double thickness of the coil that provides increased inductive coupling between coil and plasma and increased capacitance between the outer surface of dielectric and windings that facilitates breakdown of gaseous working medium volume. This increases the reliability of discharge ignition and stability of device over a wide range of process environment parameters.

Distance C from plane of the coil to the base of inner surface of the screen is selected greater than double distance A from plane of the coil to outer surface of insulator that provides a reduction in inductive coupling between the coil and conductive screen. Proposed design increases the inductance of the system, allowing you to get sufficient voltage for discharge ignition on coil windings when current in coil windings is close to desired plasma generator operating mode values and small values of eddy currents in the screen, causing wasteful high-frequency generator power losses for screen heating.

For supplying high frequency current to the coil 1 plasma generator may be provided with a coaxial input (FIG. 2), the outer conductor 4 of which is connected to one end of the coil and the inner conductor 5 is connected to other end of the coil;

Coaxial input can be arranged to supply therethrough a cooling fluid or gas to the coil. Coil conductors may be hollow to supply therethrough a cooling fluid or gas.

The use of coaxial input allows reducing the inductance of plasma generator power circuits, its supply voltage and noise level.

An insulator separating the coil from working surface of device may be made of material resistant to plasma such as quartz or ceramic plate 6 (FIG. 3).

The outer surface of insulator may be closed by at least one dielectric screen 7 made of material resistant to plasma, with the distance from plane of the coil to outer surface of dielectric screen less than double thickness of the coil 7 (FIG. 5).

The outer surface of insulator is closed by at least two dielectric screens 7, one of which is made of a material resistant to plasma, with a gap between the screens (FIG. 6).

Insulating filling may consist of dielectric cylinder 3a, separating the coil 1 from the base of inner surface of the screen, dielectric inserts 3b, filling the space between the coil windings, and dielectric plate 6 separating the coil from the working surface of the device (FIG. 7).

Plasma generator of second embodiment has flat coil 1.

Flat coil design ensures simultaneously maximum inductive coupling between coil and plasma and minimal inductive coupling between coil and screen within given size of device.screen 2 is designed as a ring which axis is perpendicular to plane of the coil, the edge of the ring facing the volume, where it is required to generate plasma, is enclosed with dielectric. The ring is made of conductive material (e.g., aluminum or aluminum alloy).screen ring design can limit (localize) the scope of high-frequency electromagnetic fields, which increases the efficiency of power input to plasma in working volume, prevents the occurrence of spurious discharge around the device that leads to useless energy losses and reduces the stability and reliability of operation. Also, the use of screen of well conductive material (e.g. aluminum) allows to avoid interference in the surrounding parts of the working chamber and tooling that often are made of poorly conducting materials (e.g., stainless steel), so that crosstalk leads to considerable losses of high-frequency power.

Plasma generator of the third embodiment has the screen electrically connected to one end of the coil. The permittivity of dielectric between the coil windings and between the coil and the screen is in the range of 2.5 to 50.

Use of dielectric of 2.5 to 50 dielectric capacitivity increases the capacitance of the coil to the screen, connected to one end of the coil that can partially compensate coil self-inductance, to reduce high frequency current required to power the device and to reduce energy losses in power supply circuits. The use of dielectric with dielectric constant of less than 2.5 will not lead to significant increase in capacitance and of higher than 50 will lead to substantial increase of interturn capacitance.

In addition, plasma generators of all three embodiments have dielectric that separates coil from the working surface of the device made of material resistant to plasma. The outer surface of insulator is closed by at least one dielectric screen made of material resistant to plasma, with the distance from plane of the coil to outer surface of dielectric screen less than double thickness of the coil. There is a gap between the screen and outer surface of dielectric. The outer surface of insulator can be also closed by at least two dielectric screens, one of which is made of material resistant to plasma, with a gap between the screens.

Insulating filling consists of dielectric cylinder, separating the coil from the base of inner surface of the screen, dielectric inserts, filling the space between the coil windings, and dielectric plate separating the coil from working surface of device. Dielectric plate is made of material resistant to plasma. Between dielectric plate and coil, as well as between dielectric plate and dielectric inserts, there is a gap. The outer surface of insulator is closed by at least one dielectric screen made of material resistant to plasma, with the distance from plane of the coil to outer surface of dielectric screen less than double thickness of the coil. There is a gap between the screen and outer surface of dielectric.

The plasma generator operates as follows. The device is placed in the working chamber; the outer surface of dielectric should be in that part of the chamber, where it is required to generate plasma of maximum density. The camera is pressurized to 0.01 . . . 500 Pa. Flow of current in the coil is provided by supplying high-frequency voltage to the coil. If amperage value is sufficient for the emergence and maintenance of high-frequency inductive discharge plasma, plasma is generated in working chamber. High-frequency electromagnetic field is displaced from plasma and is compressed against the coil. Good electromagnetic coupling between the coil and plasma is able because the distance from coil to outer surface of dielectric is not more than double thickness of the coil.

Proposed constructive design of generator provides higher plasma density and increased purity of plasma environment than in prior one, under the same conditions in the discharge chamber and at the same RF power supply. Proposed device has high efficiency, is reliable in operation, has an extended lifetime and compact size.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. Plasma generator comprising a spiral coil, placed inside a conducting screen, an inner surface of which has a cylindrical shape, wherein space between windings of the spiral coil and between the spiral coil and the screen is filled with a dielectric having an outer surface, the spiral coil is flat, the distance from the plane of the spiral coil to an outer surface of the dielectric is less than double thickness of the spiral coil, and a distance from the plane of the coil to the base of the inner surface of the screen is greater than double distance from the plane of the spiral coil to the outer surface of the dielectric.

2. Plasma generator as set forth in claim 1 wherein coaxial input provided for supplying high frequency current to the spiral coil, an inner conductor of which is connected to one end of the spiral coil, and an outer conductor is connected to the other end of the spiral coil.

3. The plasma generator as set forth in claim 2 wherein the coaxial input is arranged to supply therethrough a cooling fluid or gas to the spiral coil.

4. Plasma generator as set forth in claim 1 wherein the outer surface of the dielectric is closed by at least one dielectric screen made of a material resistant to plasma, with the distance from the plane of the spiral coil to the outer surface of the dielectric screen less than double thickness of the spiral coil.

5. Plasma generator as set forth in claim 4, characterized by the presence of a gap between the dielectric screen and the outer surface of the dielectric.

* * * * *